(12) United States Patent  
Yamazaki et al.

(10) Patent No.: US 9,006,757 B2  
(45) Date of Patent: Apr. 14, 2015

(54) METHOD OF DRIVING A LIGHT EMITTING DEVICE

(71) Applicant: Semiconductor Energy Laboratory Co., Ltd., Atsugi-shi, Kanagawa-ken (JP)

(72) Inventors: Shunpei Yamazaki, Tokyo (JP); Mitsuaki Osame, Kanagawa (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/955,154

(22) Filed: Jul. 31, 2013

(65) Prior Publication Data

US 2013/0313578 A1   Nov. 28, 2013

Related U.S. Application Data

(63) Continuation of application No. 13/347,780, filed on Jan. 11, 2012, now Pat. No. 8,502,241, which is a continuation of application No. 12/238,035, filed on Sep. 25, 2008, now Pat. No. 8,101,439, which is a continuation of application No. 10/425,708, filed on Apr. 30, 2003, now Pat. No. 7,445,946.

(30) Foreign Application Priority Data

Apr. 30, 2002   (JP) .................................. 2002-129424

(51) Int. Cl.  
 *H01L 33/00*   (2010.01)  
 *H01L 27/12*   (2006.01)  
 *H05B 33/08*   (2006.01)

(52) U.S. Cl.  
 CPC .......... *H01L 27/124* (2013.01); *H05B 33/0812* (2013.01); *H05B 33/0896* (2013.01)

(58) Field of Classification Search  
 CPC ..... H01L 33/20; H01L 33/32; H01L 33/0079; H01L 33/007; H01L 33/22; H01L 33/44; H01L 2224/48091; H01L 2224/48227; H01L 2224/32225; H01L 2224/73265; H01L 2924/00014; H01L 2924/00; H01L 33/60; H01L 33/62; H01L 33/42; H01L 33/52; H01L 33/58; H01L 33/24  
 USPC ..................... 257/40, 59, 79–781, 72; 349/44  
 See application file for complete search history.

(56) References Cited

U.S. PATENT DOCUMENTS 4,109,163 A   8/1978   Cricchi et al.  
5,130,773 A   7/1992   Tsukada (Continued)

FOREIGN PATENT DOCUMENTS

EP   0 962 984 A2   12/1999  
EP   1 061 497 A1   12/2000

(Continued)

OTHER PUBLICATIONS

Stanley Wolf, Silicon Processing for the VLSI Era; vol. 2, Process Integration; Lattice Press, 1990; p. 307, Fig. 5-6.

*Primary Examiner* — Hoa B Trinh  
(74) *Attorney, Agent, or Firm* — Fish & Richardson P.C.

(57) ABSTRACT

The present invention is characterized in that a transistor with its L/W set to 10 or larger is employed, and that $|V_{DS}|$ of the transistor is set equal to or larger than 1 V and equal to or less than $|V_{GS}-V_{th}|$. The transistor is used as a resistor so that the resistance of a light emitting element can be held by the transistor. This slows down an increase in internal resistance of the light emitting element and the resultant current value reduction. Accordingly, a change with time in light emission luminance is reduced and the reliability is improved.

18 Claims, 11 Drawing Sheets

(56) References Cited

U.S. PATENT DOCUMENTS

| | | |
|---|---|---|
| 5,214,497 A | 5/1993 | Nanba et al. |
| 5,650,636 A | 7/1997 | Takemura et al. |
| 5,814,834 A | 9/1998 | Yamazaki et al. |
| 5,879,976 A | 3/1999 | Fujiwara |
| 5,895,935 A | 4/1999 | Yamazaki et al. |
| 5,981,970 A | 11/1999 | Dimitrakopoulos et al. |
| 6,023,074 A | 2/2000 | Zhang |
| 6,150,668 A | 11/2000 | Bao et al. |
| 6,166,397 A | 12/2000 | Yamazaki et al. |
| 6,229,506 B1 | 5/2001 | Dawson et al. |
| 6,259,117 B1 | 7/2001 | Takemura et al. |
| 6,274,887 B1 | 8/2001 | Yamazaki et al. |
| 6,297,518 B1 | 10/2001 | Zhang |
| 6,399,520 B1 | 6/2002 | Kawakami et al. |
| 6,445,005 B1 | 9/2002 | Yamazaki et al. |
| 6,531,713 B1 | 3/2003 | Yamazaki |
| 6,583,775 B1 | 6/2003 | Sekiya et al. |
| 6,583,776 B2 | 6/2003 | Yamazaki et al. |
| 6,614,054 B1 | 9/2003 | Ahn |
| 6,734,836 B2 | 5/2004 | Nishitoba |
| 6,777,255 B2 | 8/2004 | Yamazaki |
| 6,777,710 B1 | 8/2004 | Koyama |
| 6,791,129 B2 | 9/2004 | Inukai |
| 6,828,585 B2 | 12/2004 | Ueda |
| 6,995,520 B2 | 2/2006 | Inukai |
| 7,053,890 B2 | 5/2006 | Inukai |
| 7,129,917 B2 | 10/2006 | Yamazaki et al. |
| 7,215,304 B2 | 5/2007 | Tsuchiya et al. |
| 7,262,556 B2 | 8/2007 | Osame et al. |
| 8,502,241 B2 * | 8/2013 | Yamazaki et al. ............... 257/88 |
| 2002/0047568 A1 | 4/2002 | Koyama |
| 2002/0097350 A1 | 7/2002 | Haven et al. |
| 2002/0153844 A1 | 10/2002 | Koyama |
| 2003/0016196 A1 | 1/2003 | Lueder et al. |
| 2003/0062499 A1 | 4/2003 | Yamazaki |
| 2003/0089905 A1 | 5/2003 | Udagawa et al. |
| 2003/0146888 A1 | 8/2003 | Yamazaki et al. |
| 2003/0164522 A1 | 9/2003 | Kato et al. |
| 2003/0203523 A1 | 10/2003 | Yamazaki et al. |
| 2003/0222589 A1 | 12/2003 | Osame et al. |
| 2004/0266042 A1 | 12/2004 | Yamazaki |
| 2007/0052634 A1 | 3/2007 | Yamazaki et al. |
| 2008/0170005 A1 | 7/2008 | Osame et al. |
| 2010/0224868 A1 | 9/2010 | Udagawa et al. |

FOREIGN PATENT DOCUMENTS

| | | |
|---|---|---|
| EP | 1 063 630 A2 | 12/2000 |
| EP | 1 087 336 A2 | 3/2001 |
| EP | 1 087 366 A2 | 3/2001 |
| EP | 1 103 946 A2 | 5/2001 |
| EP | 1 150 273 A2 | 10/2001 |
| EP | 1 178 462 A2 | 2/2002 |
| JP | 05-190284 A | 7/1993 |
| JP | 05-205873 A | 8/1993 |
| JP | 08-234683 A | 9/1996 |
| JP | 2000-029403 A | 1/2000 |
| JP | 2000-340798 A | 12/2000 |
| JP | 2001-005426 A | 1/2001 |
| JP | 2001-060076 A | 3/2001 |
| JP | 2001-134780 A | 5/2001 |
| JP | 2001-318627 A | 11/2001 |
| JP | 2001-343933 A | 12/2001 |
| JP | 2002-023697 A | 1/2002 |
| JP | 2002-082651 A | 3/2002 |
| JP | 2002-108285 A | 4/2002 |
| JP | 2002-124377 A | 4/2002 |
| JP | 2003-059650 A | 2/2003 |
| JP | 2003-308030 A | 10/2003 |
| JP | 03986051 B2 | 10/2007 |
| WO | WO9848403 A1 | 10/1998 |

* cited by examiner

METHOD OF DRIVING A LIGHT EMITTING DEVICE

CROSS-REFERENCE TO RELATED APPLICATIONS

This application is a continuation of U.S. application Ser. No. 13/347,780, filed Jan. 11, 2012, now allowed, which is a continuation of U.S. application Ser. No. 12/238,035, filed Sep. 25, 2008, now U.S. Pat. No. 8,101,439. which is a continuation of U.S. application Ser. No. 10/425,708, filed Apr. 30, 2003, now U.S. Pat. No. 7,445,946, which claims the benefit of a foreign priority application filed in Japan as Serial No. 2002-129424 on Apr. 30, 2002, all of which are incorporated by reference.

BACKGROUND OF THE INVENTION

1. Field of the Invention

The present invention relates to a technique of a light emitting device using a light emitting element, and more specifically to a technique of a light emitting device controlling an applied voltage of the light emitting element with electric field effect type transistors.

2. Description of the Related Art

In recent years, the development of a display device for displaying an image has been progressed. As the display device, a liquid crystal display device for displaying an image using a liquid crystal element has been widely used for a display screen of a mobile telephone by taking advantages of a high image quality, a thin type, a light weight, and the like.

On the other hand, in recent years, the development of a light emitting device using a light emitting element has been also progressed. The light emitting device has features such as a high response speed, superior moving picture display, and wide viewing characteristic in addition to advantages of the existing liquid crystal display device. Thus, it has been noted as a next-generation compact mobile flat panel display capable of using moving picture contents.

The light emitting element is made of broad materials such as an organic material, an inorganic material, a thin film material, a bulk material, or a dispersion material. Of them, as a typical light emitting element, there is an organic light emitting diode (OLED) mainly made of an organic material. The light emitting element has a structure in which an anode, a cathode, and a light emitting layer sandwiched between the anode and the cathode are provided. The light emitting layer is made of one or plural materials selected from the above-mentioned materials. Note that the amount of current flowing between both electrodes of the light emitting element is in direct proportion to light emission luminance.

In many cases, a plurality of pixels each having a light emitting element and at least two transistors are provided in the light emitting device. In each of the pixels, a transistor connected in series with the light emitting element (hereinafter indicated as a driver transistor) has a function for controlling light emission of the light emitting element. When a gate-source voltage (hereinafter indicated as $V_{GS}$) of a driver transistor and a source-drain voltage (hereinafter indicated as $V_{DS}$) thereof are changed as appropriate, the driver transistor cart be operated in a saturation region or a nonsaturation region.

When the driver transistor is operated in the saturation region ($|V_{GS}-V_{th}|<|V_{DS}|$), the amount of current flowing between both electrodes of the light emitting element is greatly dependent on a change in $|V_{GS}|$ of the driver transistor but not dependent on a change in $|V_{DS}|$. Note that a drive method of operating the driver transistor in the saturation region is called constant current drive. FIG. 9A is a schematic view of a pixel to which the constant current drive is applied. In the constant current drive, a gate electrode of the driver transistor is controlled to flow the necessary amount of current into the light emitting element. In other words, the driver transistor is used as a voltage control current source and the driver transistor is set such that a constant current flows between a power source line and the light emitting element.

On the other hand, when the driver transistor is operated in the nonsaturation region ($|V_{GS}-V_{th}|>|V_{DS}|$), the amount of current flowing between both electrodes of the light emitting element is changed according to both values of $|V_{GS}|$ and $|V_{DS}|$, more specifically, $|V_{DS}|$ is changed depending on the value of $|V_{GS}|$ and in a range within 1V at the maximum. Note that a drive method of operating the driver transistor in nonsaturation region is called constant voltage drive. FIG. 9B is a schematic view of a pixel to which the constant voltage drive is applied. In the constant voltage drive, the driver transistor is used as a switch, and a power source line and the light emitting element are shorted if necessary, thereby flowing a current into the light emitting element.

There is provided a light emitting device capable of displaying clear multi-gradation colors using pixels which perform such constant voltage driving. Further, there also is provided a light emitting device applicable to a time-gradation method. (see Patent References 1 and 2).

[Patent Reference 1] JP 2001-343933 A

[Patent Reference 2] JP 2001-5426 A

Light emitting elements by nature increase their resistance (internal resistance) with time. An increase in internal resistance causes reduction in amount of current flowing between anodes and cathodes of light emitting elements because the current is in reverse proportion to the resistance. In short, the luminance of a light emitting element is lowered with time and this makes it difficult to obtain a desired light emission luminance.

SUMMARY OF THE INVENTION

The present invention has been made in view of the above, and an object of the present invention is therefore to provide a method of driving a light emitting device by constant voltage driving which can slow down current reduction with time and improve the reliability.

According to an aspect of the present invention, there is provided a method of driving a light emitting device having a light emitting element and a driving transistor, the transistor being connected to the light emitting element, the transistor having a channel with W and a channel length L which satisfy L/W≥10, the method being characterized in that a voltage is applied to a gate electrode of the driving transistor and to a drain electrode or source electrode thereof so that a gate-source voltage $V_{GS}$, source-drain voltage $V_{DS}$, and threshold voltage $V_{th}$ of the driving transistor satisfy. $1 \leq |V_{DS}| \leq |V_{GS}-V_{th}|$.

According to another aspect of the present invention, there is provided a method of driving a light emitting device having a light emitting element and first and second driving transistors, the transistors being connected to the light emitting element, the transistors having a channel width W and a channel length L which satisfy L/W≥10, the method being characterized in that:

the first and second driving transistors are connected in series;

a channel width $W_1$ and channel length $L_1$ of the first driving transistor and a channel width $W_2$ and channel length $L_2$ of the second driving transistor satisfy $(L_1+L_2)/W_1 \geq 10$ and $(L_1+L_2)/W_2 \geq 10$;

a voltage is applied to a gate electrode of the first driving transistor and to a drain electrode or source electrode thereof so that a gate-source voltage $V_{GS1}$, source-drain voltage $V_{DS1}$, and threshold voltage $V_{th1}$ of the first driving transistor satisfy $1 \leq |V_{DS1}| \leq |V_{GS1} - V_{th1}|$; and a voltage is applied to a gate electrode of the second driving transistor and to a drain electrode or source electrode thereof so that a gate-source voltage $V_{GS2}$, source-drain voltage $V_{DS2}$, and threshold voltage $V_{th2}$ of the second driving transistor satisfy $1 \leq |V_{DS2}| \leq |V_{GS2} - V_{th2}|$.

To summarize the above, a light emitting device to which the present invention is applied is characterized by using a driving transistor with its L/W set to equal to or larger than 10. The present invention is characterized by operating a driving transistor with its $|V_{DS}|$, which is nearly zero in prior art, set equal to or larger than 1 V and equal to or smaller than $|V_{GS} - V_{th}|$. Operating the driving transistor at $|V_{DS}|$ in the above range makes it possible to use the driving transistor as a resistor. This makes the current flowing between electrodes of a light emitting element inversely related to the sum of resistance of the light emitting element and resistance of the driving transistor. In short, the current value in the present invention is in reverse proportion to the sum of resistance values of the light emitting element and of the driving transistor whereas the current value in prior art is in reverse proportion to the resistance value of the light emitting element alone. As a result, the reduction with time in current value of the light emitting element can be slowed down. Accordingly, lowering of light emission luminance with time is reduced and the reliability is improved.

The present invention is also characterized in that a voltage is applied to a gate electrode of the driving transistor and to a drain electrode or a source electrode thereof so that the driving transistor operates with its $|V_{DS}|$ set equal to or larger than 1 V and equal to or smaller than $|V_{GS} - V_{th}|$. In, other words, the present invention is characterized in that a voltage is applied to a signal line for inputting a signal to the gate electrode of the driving transistor and is applied to a power supply line connected with the source electrode or drain electrode of the driving transistor to give these lines appropriate electric potentials. To elaborate, the invention is characterized in that the electric potential of a signal to be inputted to the gate electrode of the driving transistor, the electric potential of a signal line driving circuit connected to a signal line that outputs the above signal, the electric potential of a power supply line connected to the source electrode or drain electrode of the driving transistor, and the electric potential of a power supply circuit connected to the power supply line are set to their respective appropriate levels.

The present invention employs a transistor with its L/W set to 10 or larger and therefore is characterized in that $|V_{GS}|$ of the driving transistor is held by a capacitor between the gate electrode and channel formation region of the driving transistor. In other words, a transistor in the present invention can double as a capacitor element and influence of fluctuation in characteristic of the transistor itself is reduced.

DETAILED DESCRIPTION OF THE PREFERRED EMBODIMENTS

Embodiment Mode 1

An embodiment mode of the present invention will be described with reference to FIGS. 1A to 4D.

Figure 4A:
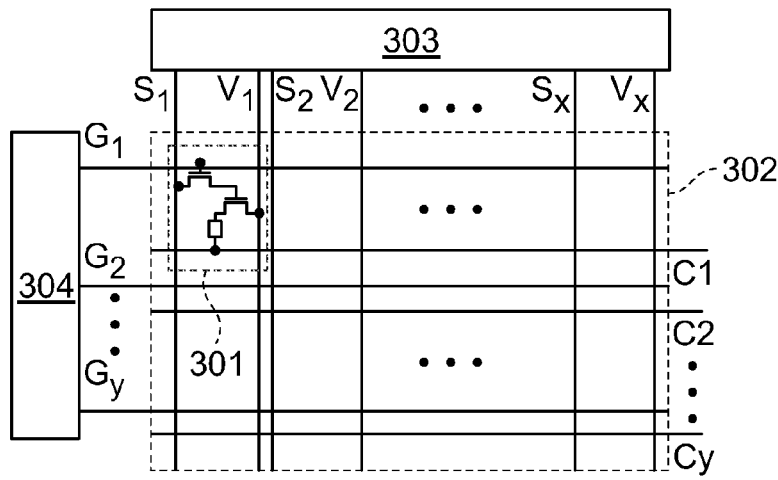
FIGS. 4A to 4D are diagrams showing a light emitting device according to the present invention.

FIG. 4A shows an outline of a light emitting device to which the present invention is applied. The light emitting device has a pixel portion 302 and a signal line driving circuit 303 and scanning line driving circuit 304 which are placed in the periphery of the pixel portion 302.

The pixel portion 302 has x signal lines $S_1$ to $S_x$ and x power supply lines $V_1$ to $V_x$ which are arranged in the column direction, as well as y scanning lines $G_1$ to $G_y$, and y power supply lines $C_1$ to $C_y$ which are arranged in the row direction (x and y are natural numbers). A region surrounded by one of the x signal lines $S_1$ to $S_x$, one of the x power supply lines $V_1$ to $V_x$, one of the y scanning lines $G_1$ to $G_y$, and one of the y power supply lines $C_1$ to $C_y$ corresponds to a pixel 301. In the pixel portion 302, the pixel 301 and similarly structured pixels are arranged to form a matrix pattern.

The signal line driving circuit 303 and the scanning line driving circuit 304 may be formed integrally on the same substrate where the pixel portion 302 is formed. Alternatively, the driving circuits may be placed outside of the substrate on which the pixel portion 302 is formed. The light emitting device may have more than one signal line driving circuit 303 and more than one scanning line driving circuit 304. Arbitral numbers can be set for the signal line driving circuit 303 and the scanning line driving circuit 304 so as to suit the structure of the pixel portion 301. Signals and power are supplied to the signal line driving circuit 303 and the scanning line driving circuit 304 through an FPC or the like (not shown in the drawing) from the external. The power supply lines $C_1$ to $C_y$ are connected to a power supply circuit, which may be integrated with the pixel portion 302 or may be external and connected to the pixel portion 302 through an FPC or the like.

Light emitting devices in the present invention include a light emitting panel in which a pixel portion with a light emitting element and driving circuits are sealed between a substrate and a cover member, a light emitting module obtained by mounting an IC or the like to the light emitting panel, and a light emitting display for use as a display device. In short, 'light emitting device' is used as the generic term for a light emitting panel, a light emitting module, a light emitting display, and the like.

The pixel 301 is on the i-th column and j-th row in the pixel portion 302. Two typical structural examples for the pixel 301 will be given and details thereof are described with reference to FIGS. 4B and 4C. The pixel 301 shown in FIG. 4B has a switching transistor 306, a driving transistor 307, and a light emitting element 308. The pixel 301 shown in FIG. 4C has an erasing transistor 309 and a scanning line $R_j$ in addition to the components of the pixel 301 of FIG. 4B.

Figure 4B:
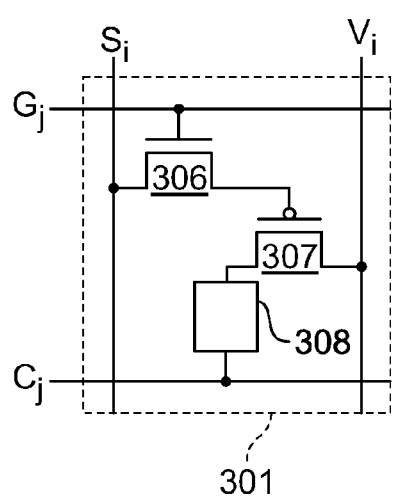
Figure 4C:
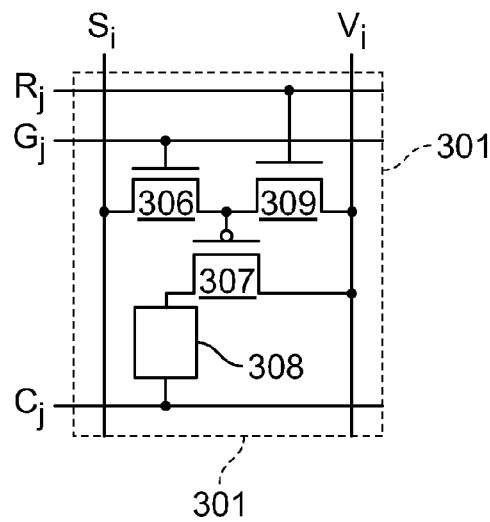

In FIGS. 4B and 4C, the switching transistor 306 has a gate electrode which is connected to a scanning line $G_j$. The switching transistor 306 also has a first electrode connected to a signal line $S_i$ and a second electrode connected to a gate electrode of the driving transistor 307. A first electrode of the driving transistor 307 is connected to a power supply line $V_i$ and a second electrode thereof is connected to one of electrodes of the light emitting element 308. The other electrode of the light emitting element 308 is connected to a power supply line $C_j$.

In FIG. 4C, the switching transistor 306 and the erasing transistor 309 are connected to each other in series between a signal line $S_i$ and a power supply line $V_i$. The erasing transistor 309 has a gate electrode connected to the scanning line $R_j$.

In this specification, one of the electrodes of the light emitting element 308 that is connected to the second electrode of the driving transistor 307 is called a pixel electrode and the other electrode connected to the power supply line $C_j$ is called an opposite electrode.

The switching transistor 306 in FIGS. 4B and 4C has a function of controlling input of signals to the pixel 301. The switching transistor 306 only has to have the function of a switch and therefore the conductivity type thereof is not particularly limited; the switching transistor 306 can be the n-channel type and the p-channel type both.

The driving transistor 307 in FIGS. 4B and 4C has a function of controlling light emission of the light emitting element 308. The conductivity type of the driving transistor 307 is not particularly limited. When the driving transistor 307 is a p-channel transistor, the pixel electrode serves as an anode whereas the opposite electrode serves as a cathode. When the driving transistor 307 is an n-channel transistor, the pixel electrode serves as a cathode whereas the opposite electrode serves as an anode.

The erasing transistor 309 in FIG. 4C has a function of stopping light emission of the light emitting element 308. The erasing transistor 309 only has to have the function of a switch and therefore the conductivity type thereof is not particularly limited; the erasing transistor 309 can be an n-channel type transistor and a p-channel type transistor.

The transistors placed in the pixel 301 can have a single-gate structure with one gate electrode as well as a multi-gate structure such as a double-gate structure with two gate electrodes and a triple-gate structure with three gate electrodes. Also, the transistors may have a top gate structure in which a gate electrode is placed above a semiconductor or a bottom gate structure in which a gate electrode is placed below a semiconductor.

The light emitting device to which the present invention is applied is characterized in that a channel length L of the driving transistor 307 is set long. Specifically, the device is characterized in that the channel length L is set several to several hundred times longer than a channel width W of the driving transistor 307.

Referring to FIGS. 1A and 1B and FIGS. 10A to 10C, a description is given on the voltage-current characteristic of a standard-sized transistor which is designed to have a standard (common) L/W value, 0.5, and the voltage-current characteristic of a long-sized transistor of the present invention in which L/W is 100. Also described is the voltage-current characteristic of the light emitting element 308 when the driving transistor 307 is the long-sized transistor.

Figure 1A:
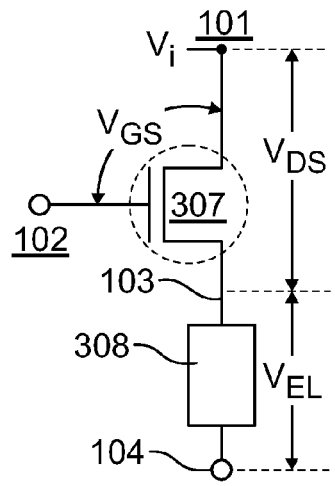
FIGS. 1A and 1B are diagrams illustrating voltage-current characteristics.

FIG. 1A shows a portion of the pixel 301 of FIGS. 4A to 4D where the driving transistor 307 is connected to the light emitting element 308. In FIG. 1A, the source electrode of the driving transistor 307 which is connected to the power supply line $V_i$ is denoted by 101 and the gate electrode of the driving transistor 307 is denoted by 102. The pixel electrode of the light emitting element 308 (the drain electrode of the driving transistor 307) is denoted by 103 and the opposite electrode is denoted by 104. The source-drain voltage of the driving transistor 307 is denoted by $V_{DS}$. The voltage between the pixel electrode 103 and the opposite electrode 104 is denoted by $V_{EL}$.

Figure 1B:
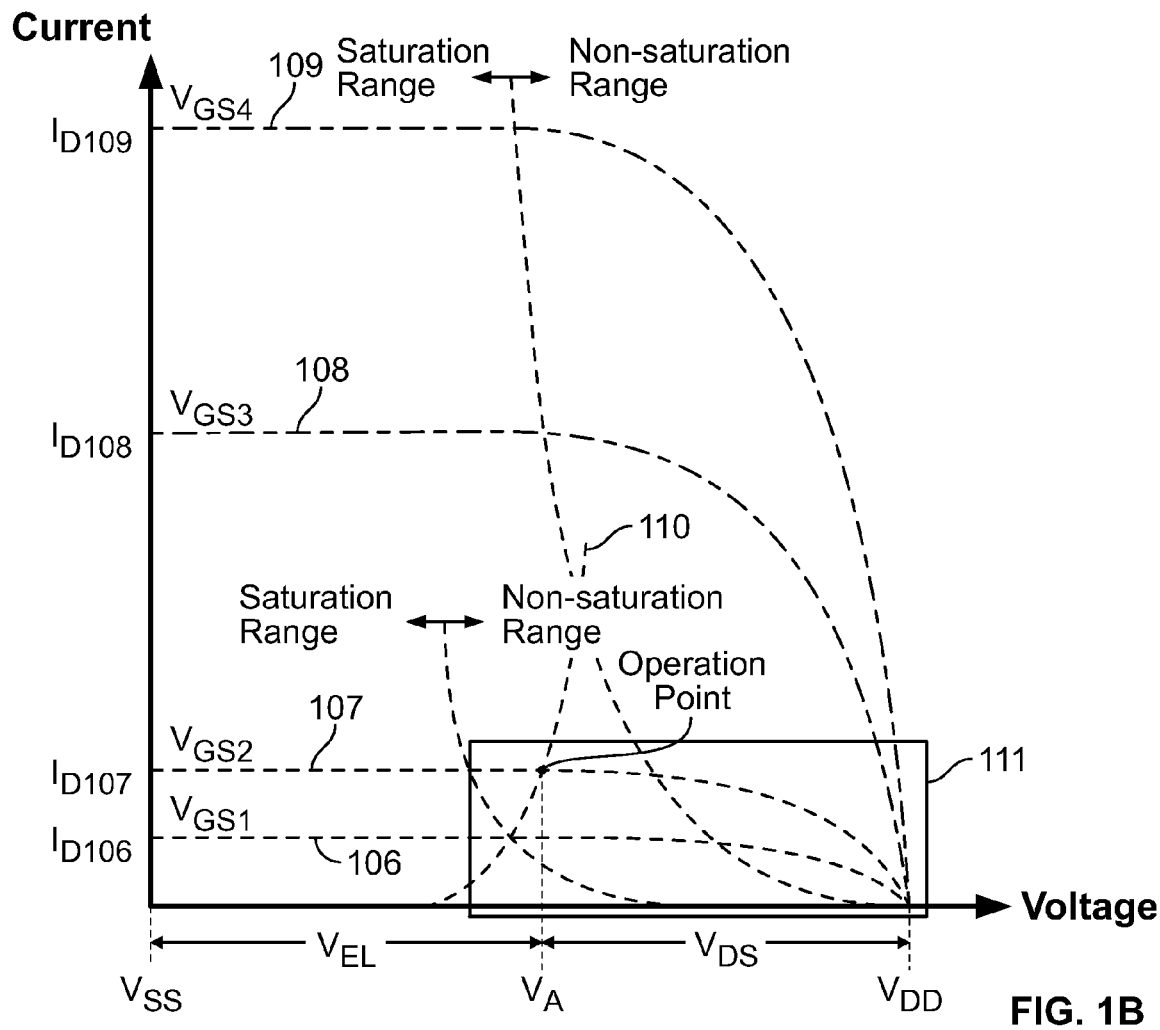

FIG. 1B shows voltage-current characteristics 106 and 107 of when $V_{GS1}$ and $V_{GS2}$ ($V_{GS1}$<$V_{GS2}$) are applied to the long-sized transistor, voltage current characteristics 108 and 109 of when $V_{GS3}$ and $V_{GS4}$ ($V_{GS3}$<$V_{GS4}$) are applied to the standard-sized transistor, and a voltage-current characteristic 110 of the light emitting element 308. Since the driving transistor 307 and the light emitting element 308 are connected in series, the same amount of current flows in the transistor and the light emitting element. Accordingly, the driving transistor 307 and the light emitting element 308 are driven at an intersection point (operation point) of the curves that indicate their voltage-current characteristics.

As shown in FIG. 1B, according to the voltage-current characteristics of the standard-sized and long-sized transistors, a current value $I_D$ rises as $V_{DS}$ is increased. Then the current value $I_D$ reaches saturation when $V_{DS}$ passes a certain voltage level. The $V_{DS}$ value at which the current value $I_D$ reaches saturation varies depending on $V_{GS}$.

Figure 10A:
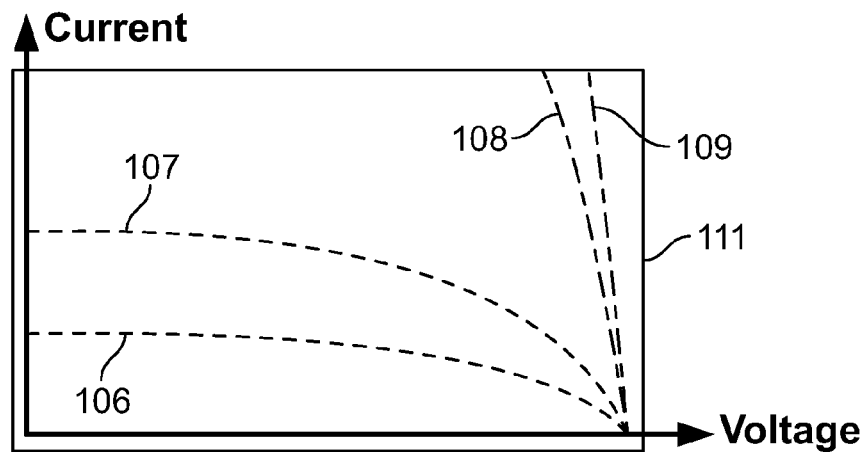
FIGS. 10A to 10C are diagrams illustrating voltage-current characteristics.
Figure 10B:
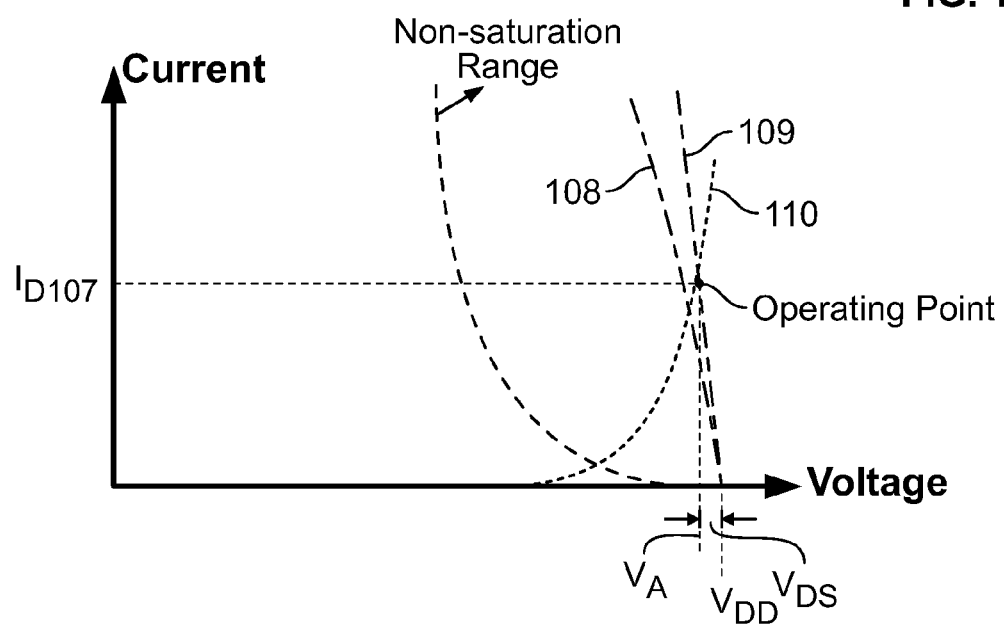
Figure 10C:
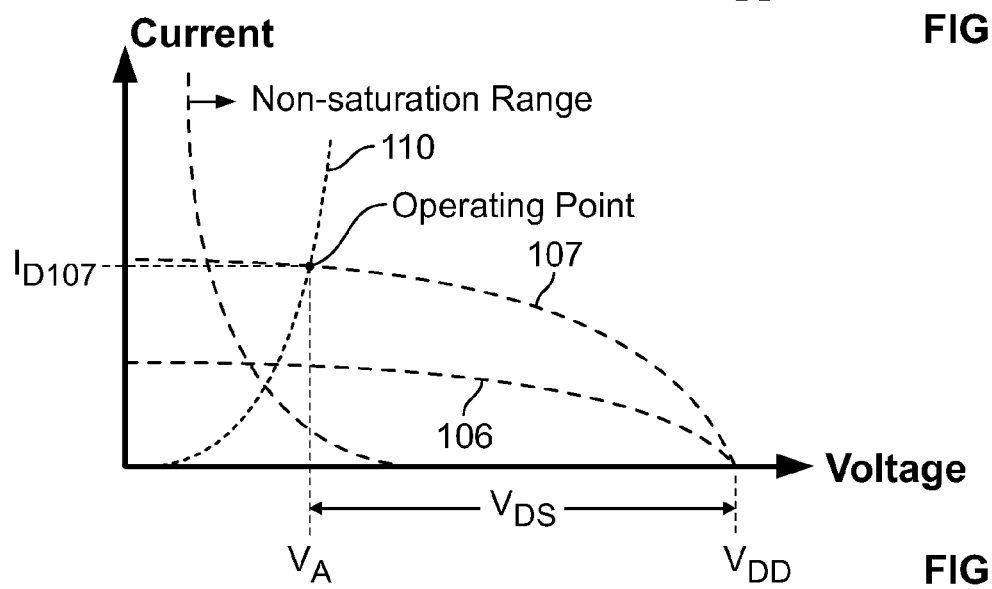

Here, the desired value of current flowing between the electrodes of the light emitting element 308 is given as $I_{D107}$ and a portion 111 of FIG. 1B is enlarged in FIG. 10A. FIG. 10B shows the voltage-current characteristics 108 and 109 of the standard-sized transistor and the voltage-current characteristic 110 of the light emitting element 308. FIG. 10C shows the voltage-current characteristics 106 and 107 of the long-sized transistor and the voltage-current characteristic 110 of the light emitting element 308.

As shown in FIG. 10A, in the region denoted by 111, the curves 108 and 109 of the standard-sized transistor are sharply inclined whereas the curves 106 and 107 of the long-sized transistor are gently inclined.

The difference in inclination originates from the difference in L/W between the transistors. The standard-sized transistor has an L/W value of 0.1 to 2 and therefore $V_{DS}$ of the transistor cannot be set large. The $V_{DS}$ value is far smaller than $V_{EL}$ and nearly zero as shown in FIG. 10B. In short, the curve of the standard-sized transistor has a sharp inclination because the drain current $I_D$ is rapidly increased accompanying a change in $V_{DS}$ and reaches saturation when $V_{DS}$ passes a certain voltage level.

In contrast, the long-sized driving transistor is characterized by setting L/W to 10 or larger and operating with its $|V_{DS}|$ set equal to or larger than 1 V and equal to or smaller than $|V_{GS}-V_{th}|$. Operating the driving transistor at the above range of $|V_{DS}|$ makes it possible to use the driving transistor as a resistor. Therefore, as shown in FIG. 10C, the difference between $V_{DS}$ and $V_{EL}$ of the long-sized transistor is not large and a change in $V_{DS}$ causes a slow increase in drain current $I_D$. Its voltage-current characteristic curve accordingly has a gentle inclination.

The present invention employs the driving transistor 307 with its L/W set to 10 or larger and appropriate voltages are applied to the power supply line $V_i$ connected with the driving transistor 307 and to the gate electrode to set the electric potentials of the power supply line $V_i$ and the gate electrode to appropriate levels. In this way, $|V_{DS}|$ of the driving transistor 307 which is less than 1V in prior art can be set equal to or larger than 1 V and equal to or smaller than $|V_{GS}-V_{th}|$. Since the resistance of a transistor also depends on $|V_{DS}|$ of the transistor, setting $|V_{DS}|$ equal to or larger than 1 V and equal to or smaller than $|V_{GS}-V_{th}|$ causes resistance (internal resistance) in the driving transistor. As a result, the current flowing between the electrodes of the light emitting element becomes inversely related to the sum of resistance of the light emitting element and of the transistor. In short, the current value in the present invention is in reverse proportion to the sum of resistance of the light emitting element and of the driving transistor whereas the current value in prior art is in reverse proportion to the resistance of the light emitting element alone. The current value reduction with time of the light emitting element thus can be slowed down. A detailed description is given on this effect with reference to FIGS. 2A to 2E.

Figure 2A:
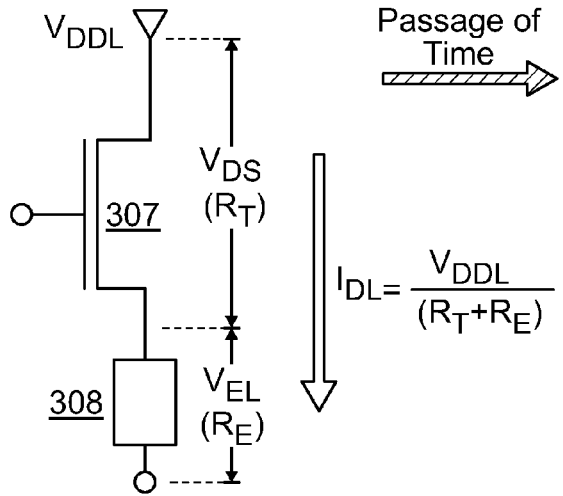
FIGS. 2A to 2E are diagrams illustrating effects of the present invention.
Figure 2B:
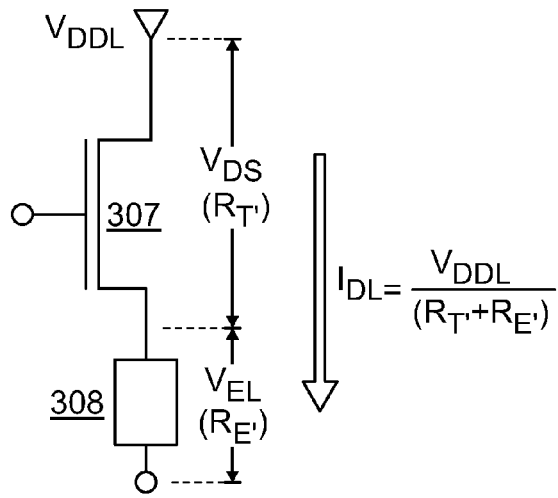
Figure 2C:
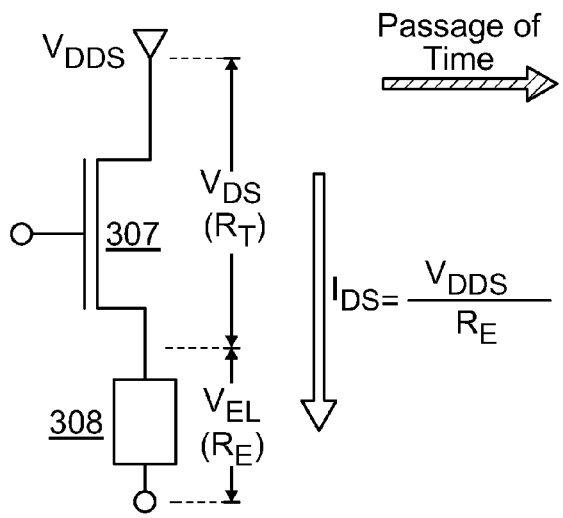
Figure 2D:
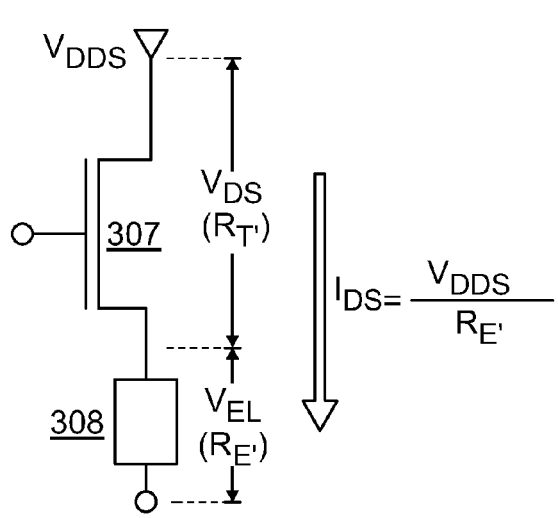
Figure 2E:
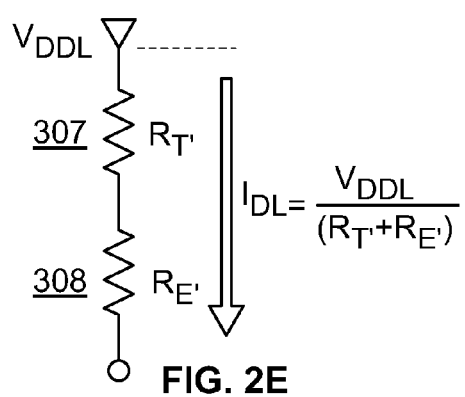

Within the above $|V_{DS}|$- range, the resistance of the transistor can slow down the reduction of the current value. In other words, the resistance of the transistor when $|V_{DS}|$ is less than 1 V is too small to hold back the reduction in current value whereas the transistor operates in a saturation range when $|V_{DS}|$ is larger than $|V_{GS}-V_{th}|$ FIGS. 2A and 2B show a portion where the long-sized driving transistor 307 and the light emitting element 308 are connected to each other. FIGS. 2C and 2D show a portion where the standard-sized driving transistor 307 and the light emitting element 308 are connected to each other. The resistance of the transistor 307 is given as $R_T$ and the resistance of the light emitting element 308 is given as $R_E$.

In FIGS. 2A and 2B, when one of the electrodes of the light emitting element 308 is grounded, the current value $I_{DL}$ satisfies the following Expression (1).

$$I_{DL}=V_{DDL}/(R_T+R_E) \quad (1)$$

In Expression (1), the resistance $R_T$ of the transistor 307 and the resistance $R_E$ of the light emitting element 308 are substantially equal to each other. With time, the resistance $R_T$ of the transistor 307 is reduced and the resistance $R_E$ of the light emitting element 308 is increased. Then the current value $I_{DL}$ of the current flowing in the light emitting element 308 satisfies the following Expression (2).

$$I_{DL}+R_{DDL}/(R_T'+R_E') \quad (2)$$

Assuming that the resistance of the light emitting element 308 becomes with time $R_E'$ which satisfies $R_E'=2\times R_E$, the rate of change of the current value $I_{DL}$ is ⅓. More accurately, $R_T$ is larger than $R_T'$ ($R_T>R_T'$) in the above Expressions (1) and (2) since the resistance $R_E$ of the light emitting element 308 increases and the resistance $R_T$ of the transistor 307 declines with time. The exact rate of change of the current value $I_{DL}$ is therefore less than ⅓.

Similarly, in FIGS. 2C and 2D, when one of the electrodes of the light emitting element 308 is grounded, a current value $I_{DS}$ of the current flowing in the light emitting element 308 satisfies the following Expression (3). The standard-sized transistor 307 has substantially no resistance $R_T$ and therefore the resistance $R_T$ here is assumed as zero.

$$I_{DS}=V_{DDS}/R_E \quad (3)$$

As the resistance of the light emitting element 308 is increased with time, the current value $I_{DS}$ of the current flowing in the light emitting element 308 now satisfies the following Expression (4).

$$I_{DS}=V_{DDS}/R_E' \quad (4)$$

Assuming that the resistance of the light emitting element 308 becomes $R_E'$ which satisfies $R_E'=2\times R_E$, the rate of change of the current value $I_{DS}$ is ½.

To summarize the above, if the resistance of the light emitting element 308 satisfies $R_E'=2\times R_E$, the rate of change of the current value is ½ when the transistor used is the standard-sized transistor whereas it is about ⅓ when the transistor used is the long-sized transistor. The use of the long-sized transistor thus reduces apparent rate of change.

As described, the current value is in reverse proportion to the resistance of the light emitting element alone when the standard-sized transistor is used. On the other hand, when the long-sized transistor of the present invention in which L/W is set to 10 or larger is employed, a voltage is applied to the power supply line (not shown in the drawings) connected with the source electrode of the driving transistor to set the power supply electric potential $V_{DDL}$ of the power supply line to an appropriate level and a voltage is applied also to the gate electrode of the driving transistor. In this way, $|V_{DS}|$ of the driving transistor 307 which is less than 1V in prior art can be set equal to or larger than 1 V and equal to or smaller than $|V_{GS}-V_{th}|$. Setting $|V_{DS}|$ equal to or larger than 1 V and equal to or smaller than $|V_{GS}-V_{th}|$ causes resistance (internal resistance) in the transistor. This makes the value of the current flowing between the electrodes of the light emitting element inversely related to the sum of resistance of the light emitting element and of the transistor as shown in the equivalent circuit of FIG. 2E. As a result, the current value reduction with time of the light emitting element can be slowed down.

The present invention employs a transistor with its L/W set to 10 or larger and therefore is characterized in that $|V_{GS}|$ of the driving transistor is held by a capacitor between the gate electrode and channel formation region of the driving transistor. In other words, a transistor in the present invention can double as a capacitor element and influence of fluctuation in characteristic of the transistor itself is reduced.

The present invention can be carried out by merely designing a driving transistor to have an L/W which is larger than usual and there is no need to add another manufacturing step. Therefore the present invention can slow down the reduction of the current value without lowering the yield in the manufacturing process.

The resistance (internal resistance) of the light emitting element 308 is changed not only with time but also by temperature shift because of its nature. To elaborate, the resistance of the light emitting element 308 declines when the temperature becomes higher than the now al temperature, namely room temperature, and rises when the temperature becomes lower than normal. According to FIG. 10B, $V_{DS}$ of the standard-sized transistor is far smaller than $V_{EL}$ and is nearly zero. This means that, when the standard-sized transistor is used, the value of the current flowing in the light emitting element is determined mainly by the resistance of the light emitting element. If the temperature rises higher than room temperature to cause a drop in resistance of the light emitting element, the light emission luminance surges resulting in degradation of the light emitting element and burn-in of a display pattern. On the other hand, according to FIG. 10C, the curve of the long-sized transistor has a gentle inclination, there is no large difference between $V_{DS}$ and $V_{EL}$, and the current value is gradually increased accompanying a change in $V_{DS}$. In short, when the long-sized transistor of the present invention is used, a change in resistance due to temperature shift does not cause a light emission surge.

Embodiment Mode 2

This embodiment describes simulation results of the standard-sized and long-sized transistors with reference to FIGS.

3A and 3B. Table 1 below shows for each transistor in the simulation the channel length L, the channel width W, the absolute value $|V_{th}|$ of the threshold, the absolute value $|V_{GS}|$ of the gate-source voltage, the electric potential 101 of the drain electrode, the electric potential 102 of the gate electrode, and the electric potential 103 of the source electrode (the electric potential of the pixel electrode). Table 1 also shows the electric potential 104 of the opposite electrode, and the current value I and resistance R of the light emitting element 308.

Table 1

Figure 3A:
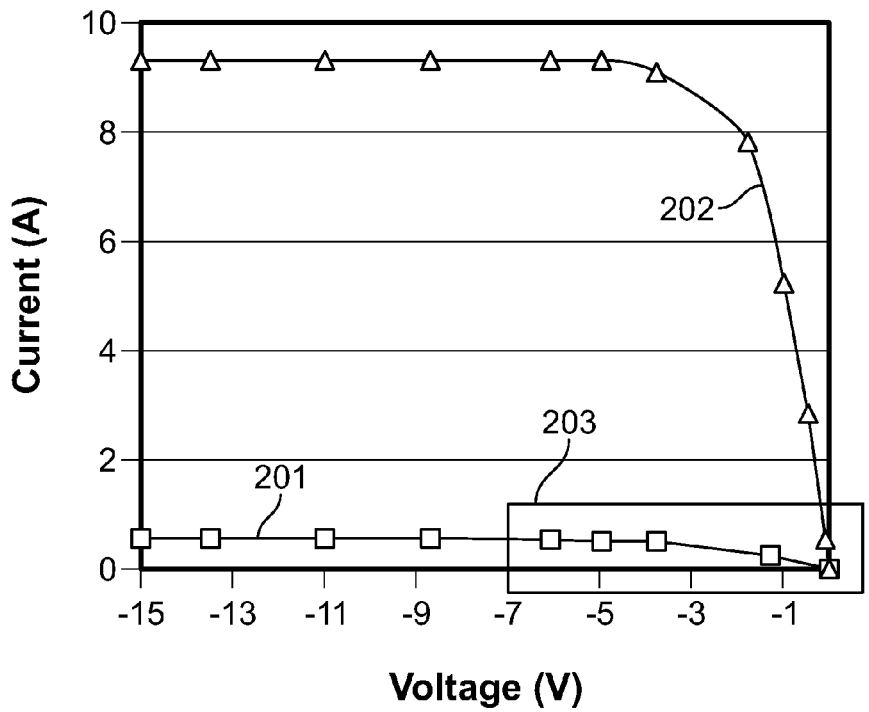
FIGS. 3A and 3B are diagrams showing simulation results.

In FIG. 3A, the voltage-current characteristic of the long-sized transistor is denoted by 201 and the voltage-current characteristic of the standard-sized transistor is indicated by 202. As shown in FIG. 3A, the voltage-current characteristic 201 of the long-sized transistor has a gentle inclination whereas the voltage-current characteristic 202 of the standard-sized transistor is sharply inclined. Both curves reach saturation when a certain voltage level or over is attained.

Figure 3B:
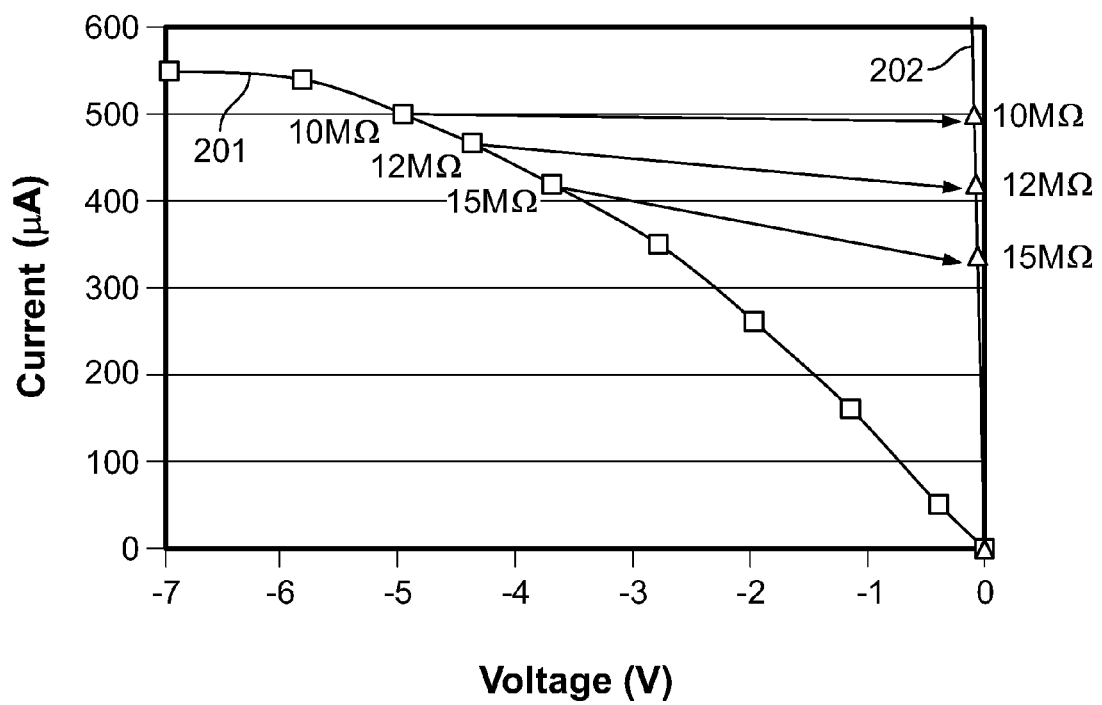

A region denoted by 203 in FIG. 3A is enlarged in FIG. 3B. Table 2 shows simulation results on the absolute value $|V_{DS}|$ (V) of the source-drain voltage of the driving transistor 307 and the current value I (nA) when the resistance of the light emitting element 308 is changed with time from 10 MΩ to 12 MΩ to 15 MΩ in FIG. 3B.

Table 2

As shown in Table 2, when the resistance of the light emitting element 308 is 10 MΩ, the same amount of current value, 500 nA flows in the long-sized transistor and the standard-sized transistor. As the resistance of the light emitting element 308 rises to 12 MΩ with time, the current value of the long-sized transistor is reduced to 467 nA whereas the current value of the standard-sized transistor is reduced down to 419 nA. Compared to the initial current value (500 nA), the rate of change of the current value of the long-sized transistor is 93% and the rate of change of the current value of the standard-sized transistor is 84%.

As time passes furthermore, the resistance of the light emitting element 308 reaches 15 MΩ to reduce the current value of the long-sized transistor to 419 nA and the current value of the standard-sized transistor to 336 nA. At this point, the rate of change from the initial current value (500 nA) is 84% for the long-sized transistor and 67% for the standard-sized transistor.

The present invention is characterized in that a voltage is applied to a gate electrode of the driving transistor and to a drain electrode or source electrode thereof so that the driving transistor operates with its $|V_{DS}|$ set equal to or larger than 1 V and equal to or smaller than $|V_{GS}-V_{th}|$. In other words, the present invention is characterized in that a voltage is applied to a signal line for inputting a signal to the gate electrode of the driving transistor and is applied to a power supply line connected with the source electrode or drain electrode of the driving transistor to give these lines appropriate electric potentials. According to the present invention, a driving transistor is operated at $|V_{DS}|$ in the above range, thereby making it possible to use the driving transistor as a resistor. This makes the value of the current flowing between electrodes of a light emitting element inversely related to the sum of resistance of the light emitting element and resistance of the driving transistor. As a result, the reduction with time in current value of the light emitting element can be slowed down. Accordingly, lowering of light emission luminance with time is reduced and the reliability is improved.

Embodiment Mode 3

In the above embodiment modes, one transistor is used as a driving transistor. This embodiment gives with reference to FIG. 4D a description on a case in which two transistors connected in series serve as a driving transistor.

Figure 4D:
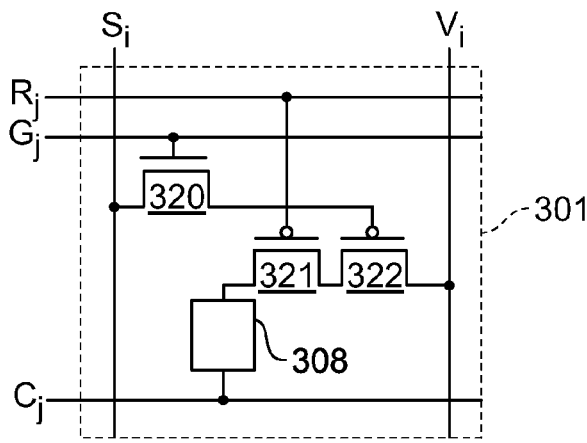

A pixel 301 shown in FIG. 4D has a scanning line $R_j$ and a driving transistor 321 in addition to the components of the pixel 301 of FIG. 4A. To be specific, the pixel 301 of FIG. 4D has a switching transistor 320, the driving transistor 321, a driving transistor 322, and a light emitting element 308.

The description given in this embodiment deals with both simulation results on a case of using one transistor for a driving transistor as shown in FIGS. 4B and 4C and simulation results on a case of using two transistors for a driving transistor as shown in FIG. 4D.

Table 3 below shows the channel length L, the channel width W, the absolute value $|V_{th}|$ of the threshold, and the absolute value $|V_{GS}|$ of the gate-source voltage for each transistor in the simulation. As shown in Table 3, the sum of channel lengths of the transistor 321 and the transistor 322 is 500 μm and is equal to the channel length of the transistor 307 by itself. Every one of these transistors has the same channel width, 7 μm.

Table 3

Table 4 shows $|V_{DS}|$ of each transistor and the current value I when the resistance of the light emitting element 308 is changed from 10 MΩ to 15 MΩ with time. The simulation results shown in this embodiment mode are of when the resistance of the light emitting element 308 is changed from 10 MΩ to 15 MΩ with time with the border between the saturation range and the non-saturation range as the starting point.

Table 4

As shown in Table 4, an increase in resistance of the light emitting element 308 from 10 MΩ to 15 MΩ with time causes a change in current value at a rate of 92% in the case where one transistor (the transistor 307) is used. On the other hand, the rate of change in current value is 98% when two transistors (the transistors 321 and 322) are used.

In short, the rate of change in current value with time is slowed down more when the sum of channel lengths of plural transistors is 500 μm than when one transistor having a channel length of 500 μM is used.

When plural transistors are used as a driving transistor, $|V_{GS}|$ of each of the transistors is set arbitrarily. If each pixel has three sub-pixels, namely an R color sub-pixel, a G color sub-pixel, and a B color sub-pixel, in order to display in multicolors, $|V_{GS}|$ to be inputted is set to an arbitral value in accordance with the light emission efficiency of the respective sub-pixels.

In the above Table 4, the rate of change when one transistor (the transistor 307) is used as a driving transistor is 92%. On the other hand, the rate of change when the long-sized transistor is employed is 84% in Table 2. This is because, as can be understood from Tables 1 and 2, and Tables 3 and 4, the rate of change varies depending on $V_{GS}$ and $V_{DS}$ even though L/W is the same and the initial current amount $I_D$ is the same.

This embodiment mode can be combined freely with Embodiment Mode 1.

Embodiment Mode 4

In this embodiment mode, the configurations and operations of the signal line driving circuit 303, the scan line driving circuit 304, will be described with reference to the FIG. 5, respectively.

Figure 5A:
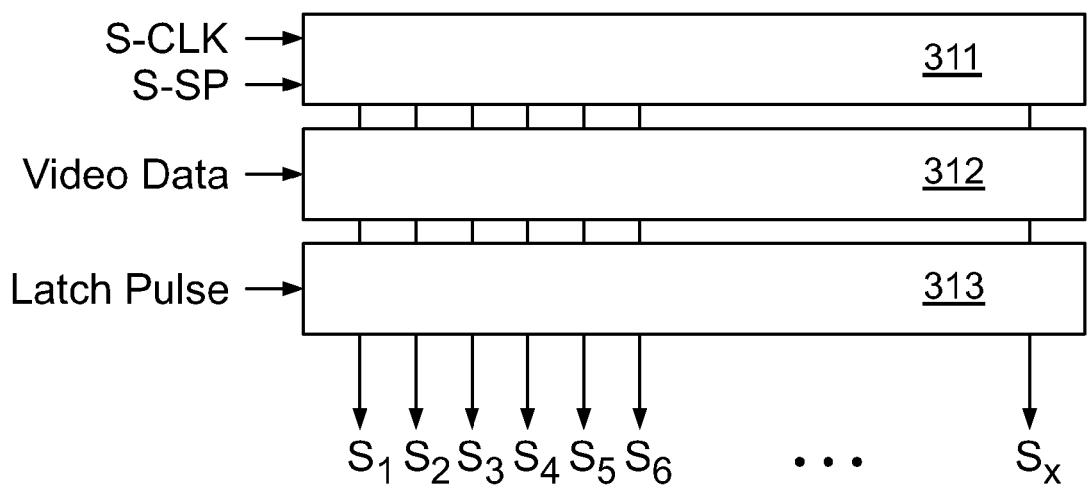
FIGS. 5A and 5B are diagrams showing a light emitting device according to the present invention.

First, the signal line driving circuit 303 is described with reference to the FIG. 5A. The signal line driving circuit 303 has a shift register 311, a first latch circuit 312 and a second latch circuit 313.

The operation of the signal driving circuit 303 is described briefly. The shift register 311 comprises a plurality of flip-flop circuits (FF), and is supplied with a clock signal (S-CLK), a start pulse (S-SP), and a clock inversion signal (S-CLKb). Sampling pulses are output one by one according to the timing of these signals.

The sampling pulse output from the shift register 311 is input into the first latch circuit 312. The first latch circuit 312 is supplied with digital video signals, which, in turn, are retained in each column according to the timing of the input of the sampling pulse.

In the first latch circuit 312, when the columns from the first to the last are filled with the retained video signals, a latch pulse is input into the second latch circuit 313 during the horizontal return line period. The video signals retained in the first latch circuit 312 are transferred to the second latch circuit 313, at the same time. Then, the one line of the video signals retained in the second latch circuit 313 is input into the signal lines $S_1$ to $S_n$, at the same time.

While the video signals retained in the second latch circuit 313 are being input into the signal lines $S_1$ to $S_n$, sampling pulses are again output from the shift register 311. The above operation is repeated.

Figure 5B:
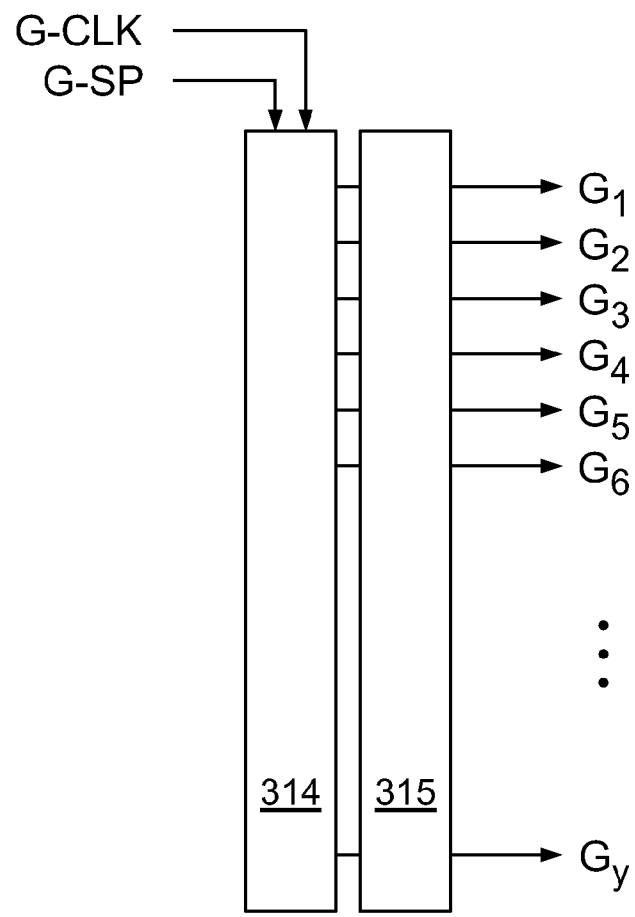

Next, the scan line driving circuit 304 is described with reference to the FIG. 5B. The scan line driving circuit 304 has a shift register 314 and a buffer 315, respectively. Briefly, the shift register 314 outputs sampling pulses one by one according to the clock signal (G-CLK), a start pulse (G-SP) and a clock inversion signal (G-CLKb). Next, the sampling pulses amplified in the buffer 315 are input into the scan line, and the scan line is turned to be a selected state one by one in response to the input of the sampling pulse. The pixel controlled by the selected scan line is supplied with digital video signals from signal lines $S_1$ to $S_n$ in sequence.

A level shifter circuit may be provided between the shift register 314 and the buffer 315. By providing a level shifter circuit, the voltage amplitudes of the logic circuit part and the buffer can be altered.

This embodiment mode can be implemented in conjunction with embodiment mode 1 and/or 3.

Embodiment Mode 5

In this embodiment mode, a drive method applied to the present invention will be briefly described.

A drive method in the case where a multi-gradation image is displayed by using a light emitting device, is broadly divided into an analog gradation method and a digital gradation method. Both methods can be applied to the present invention. A differential point between both of the methods is a method of controlling a light emitting element in respective states of light emission and non-light emission of the light emitting element. The former analog gradation method is a method of controlling the amount of current flowing into the light emitting element to obtain gradation. The latter digital gradation method is a method of driving the light emitting element with only two states of an on state (state in which luminance is substantially 100%) and an off state (state in which luminance is substantially 0%).

With respect to the digital gradation method, a combination method of a digital gradation method and an area gradation method (hereinafter indicated as an area gradation method) and a combination method of a digital gradation method and a time gradation method (hereinafter indicated as a time gradation method) have been proposed in order to represent a multi-gradation image.

The area gradation method is a method of dividing a pixel into a plurality of sub-pixels and selecting light emission or non-light emission for the respective sub-pixels to represent gradation according to a difference between a light emitting area and the other area in a pixel. In addition, the time gradation method is a method of controlling a period for which a light emitting element emits light to represent gradation as reported in Patent Reference 2. Specifically, a frame period is divided into a plurality of sub-frame periods having different lengths and light emission or non-light emission of the light emitting element is selected for each of the periods to represent gradation according to a length of a light emitting period during the frame period.

Both the analog gradation method and the digital gradation method can be applied to the light emitting device of the present invention. Further, both the area gradation method and the time gradation method are applicable. Still further, other than the above methods, any known driving method can be applied to the light emitting device of the present invention.

On the other hand, when the digital gradation method is applied, all the power source lines in the respective pixels may be set to the same potential. Thus, the power source line can be commonly used between adjacent pixels.

Note that, in a light emitting device for conducting multi-color display, a plurality of sub-pixels corresponding to respective colors of R, G, and B are provided in a pixel. With respect to the respective sub-pixels, because of a difference of current densities of respective materials for R, G, and B and a difference of transmittance of color filters therefor, there is the case where intensities of light emitted therefrom are different even when the same voltage is applied. Therefore, when the potential of the power source line is changed for each of sub-pixels corresponding to the respective colors, white balance will be improved.

This embodiment mode can be arbitrarily combined with Embodiment modes 1 to 4.

Embodiment Mode 6

Figure 7A:
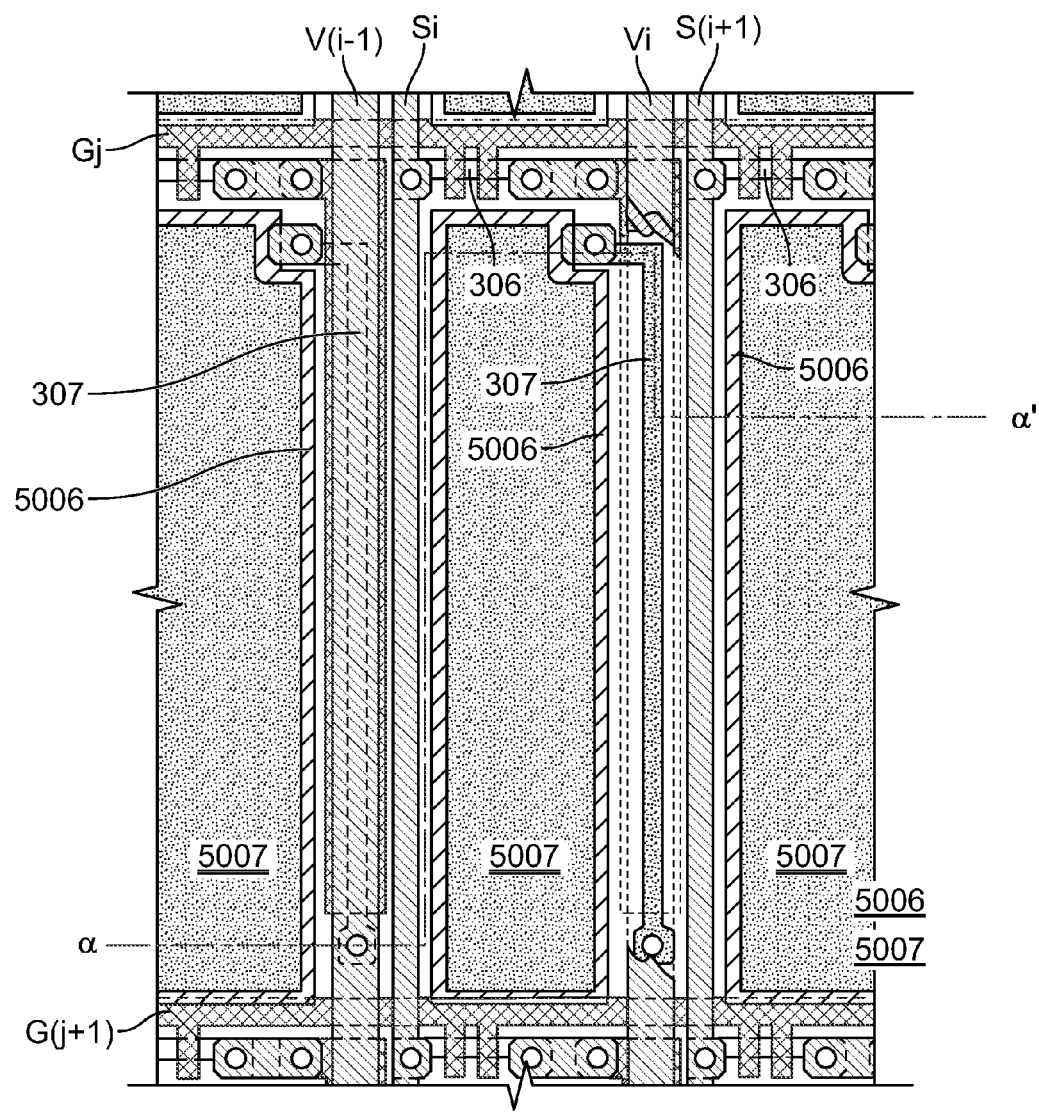
FIGS. 7A and 7B are diagrams showing layout of pixels in accordance with the present invention.
Figure 7B:
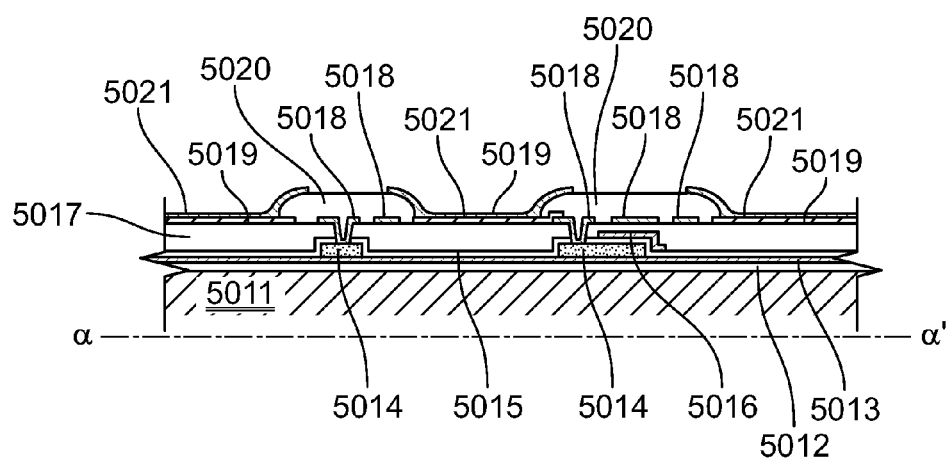

The description given in this embodiment mode with reference to FIGS. 7A and 7B is about an example of actual layout of the pixel 301 structured as shown in FIG. 4B. FIG. 7A is a top view of the pixel 301 laid out and FIG. 7B is a sectional view taken along the line α-α'.

In FIG. 7A, reference symbol 306 denotes a switching transistor, and 307, a driving transistor. Denoted by 5006 is a pixel electrode and 5007 is a light emission area. In FIG. 7B, 5011 denotes a substrate, 5012 and 5013, base films, 5014, a semiconductor, 5015, a gate insulating film, 5016, a gate electrode, 5017, a first interlayer insulating film, 5018, a wire, 5019, a pixel electrode, 5020, a partition wall, and 5021, a light emitting layer.

In FIGS. 7A and 7B, the partition wall 5020 covers regions other than the light emission area 5007. The signal line $S_i$ and the current supplying line $V_i$ can be placed under the partition wall 5020. The driving transistor 307 can be placed under the source signal line $S_i$ and the current supplying line $V_i$.

By arranging the elements of the pixel in this way, the gate electrode of the driving transistor overlaps a part of the power supply line $V_i$. Since the electric potential of the power supply line $V_i$ is fixed, the capacitance between the gate electrode of the driving transistor 307 and the power supply line $V_i$ can be used as a part of the capacitance for holding video signals.

In contrast to prior art which requires a capacitor element to hold $V_{GS}$ of the driving transistor 307, $V_{GS}$ in the present invention can be held sufficiently by the capacitance between the gate electrode and channel formation region of the driving transistor 307. In short, the driving transistor 307 of the present invention can double as a capacitor and, in addition, fluctuation in characteristic of the driving transistor 307 itself can be reduced. Also, lowering of the aperture ratio can be prevented by placing the driving transistor 307 under the partition wall 5020.

Figure 8A:
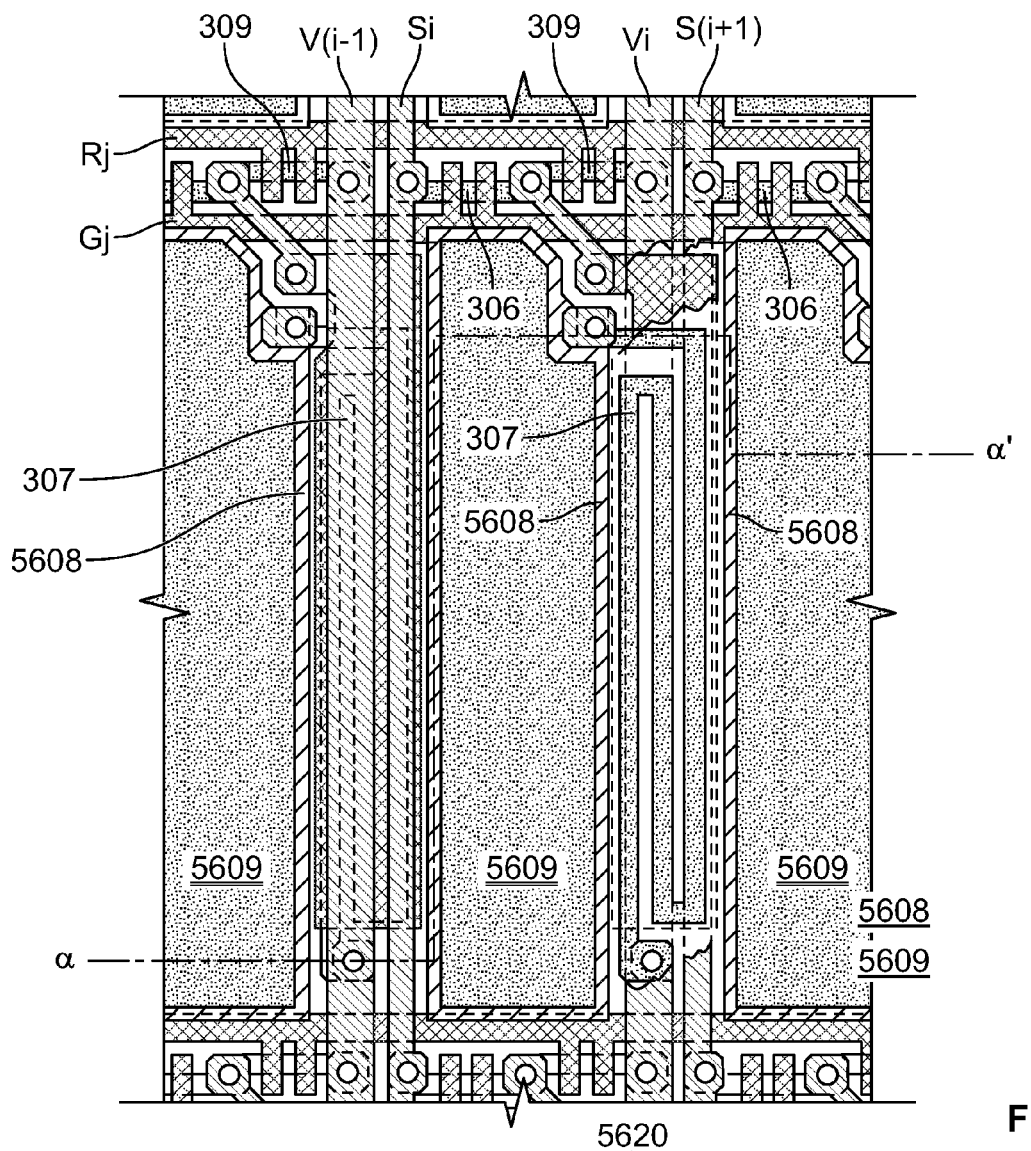
FIGS. 8A and 8B are diagrams showing layout of pixels in accordance with the present invention.
Figure 8B:
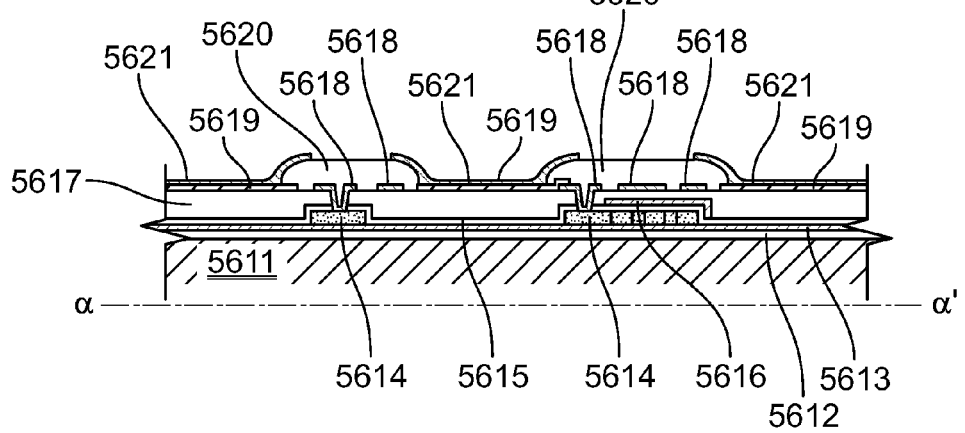
Figure 9A:
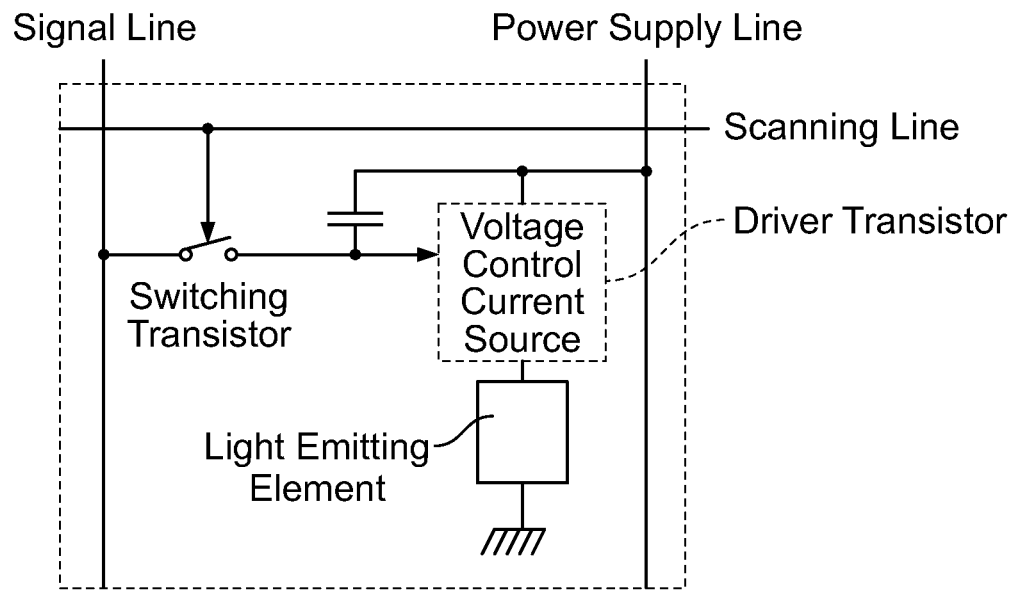
FIGS. 9A and 9B are conceptual diagrams of constant current driving and constant voltage driving, respectively.
Figure 9B:
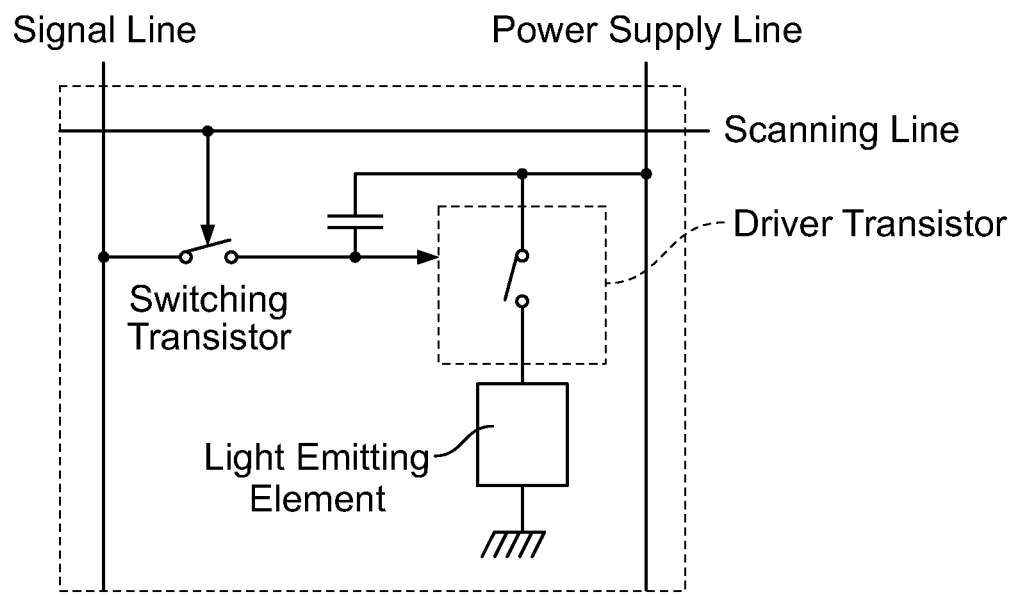

The description given next with reference to FIGS. 8A and 8B is about an example of actual layout of the pixel 301 structured as shown in FIG. 4C. FIG. 8A is a top view of the pixel laid out and FIG. 8B is a sectional view taken along the line α-α'.

In FIG. 8A, reference symbol 306 denotes a switching transistor, 307, a driving transistor, and 309, an erasing transistor. Denoted by 5608 is a pixel electrode and 5609 is a light emission area. In FIG. 8B, 5611 denotes a substrate, 5612 and 5613, base films, 5614, a semiconductor, 5615, a gate insulating film, 5616, a gate electrode, 5617, a first interlayer insulating film, 5618, a wire, 5619, a pixel electrode, 5620, a partition wall, and 5621, a light emitting layer.

In the pixel having three transistors, the opening can be simplified by lining up two of the transistors: the switching transistor 306 and the erasing transistor 309 as shown in FIG. 8A. The driving transistor 307 in FIG. 8A meanders in the longitudinal direction. This gives the opening a rectangular or similar shape and lowering of the aperture ratio is thus avoided.

The shape of the driving transistor is not limited to those shown in FIGS. 7A and 8A. The driving transistor may have the letter U shape, the letter S shape, a spiral shape, or a meander shape.

The present invention employs a transistor with its L/W set to 10 or larger and therefore is characterized in that $V_{GS}$ of the driving transistor can be sufficiently held by a capacitor between the gate electrode and channel formation region of the driving transistor. In other words, a transistor in the present invention can double as a capacitor element and influence of fluctuation in characteristic of the transistor itself is reduced.

Further, the present invention can be carried out by merely designing a driving transistor to have an L/W which is larger than usual and there is no need to add another manufacturing step. Therefore the present invention can slow down the reduction of the current value without lowering the yield in the manufacturing process.

This embodiment mode can be combined arbitrarily with Embodiment Modes 1 to 5.

Embodiment Mode 7

Electronic apparatuses to which the present invention is applied include a video camera, a digital camera, a goggles-type display (head mount display), a navigation system, a sound reproduction apparatus (such as a car audio apparatus and an audio set), a lap-top computer, a game machine, a portable information terminal (such as a mobile computer, a mobile telephone, a portable game machine, and an electronic book), an image reproduction apparatus including a recording medium (more specifically, an apparatus which can reproduce a recording medium such as a digital versatile disc (DVD) and so forth, and include a display for displaying the reproduced image), or the like. Specific examples thereof are shown in FIG. 6.

Figure 6B:
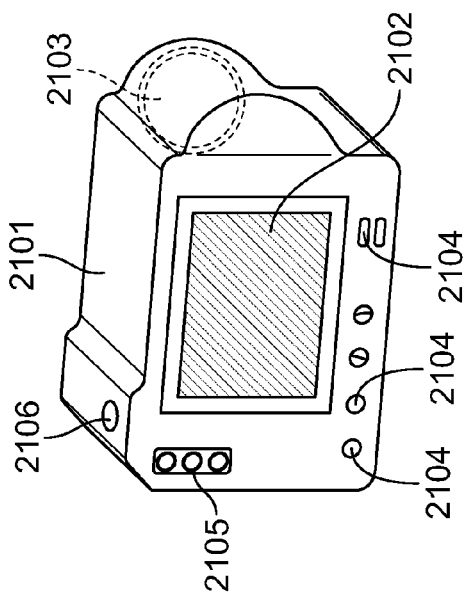
FIGS. 6A to 6H are diagrams showing electronic apparatuses to which the present invention is applied.
Figure 6D:
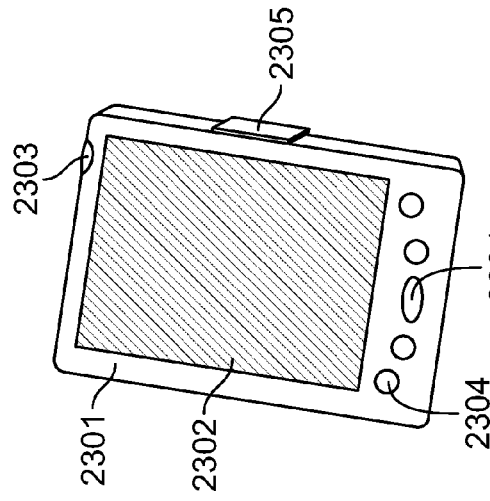
Figure 6A:
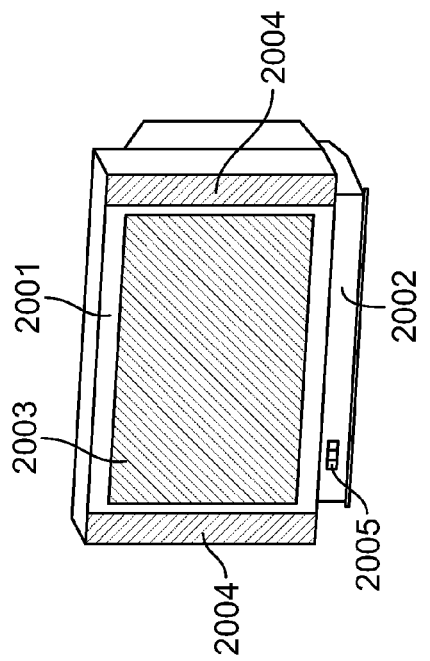

FIG. 6A illustrates a light emitting device which includes a casing 2001, a support table 2002, a display portion 2003, a speaker portion 2004, a video input terminal 2005 and the like. The present invention is applicable to the display portion 2003. The light emitting device is of the self-emission-type and therefore requires no backlight. Thus, the display portion thereof can have a thickness thinner than that of the liquid crystal display device. The light emitting device is including the entire display device for displaying information, such as a personal computer, a receiver of TV broadcasting and an advertising display.

FIG. 6B illustrates a digital still camera which includes a main body 2101, a display portion 2102, an image receiving portion 2103, an operation key 2104, an external connection port 2105, a shutter 2106, and the like. The present invention can be applied to the display portion 2102.

Figure 6C:
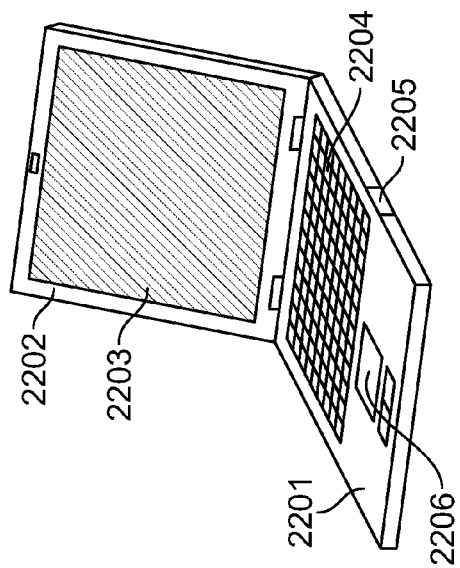

FIG. 6C illustrates a lap-top computer which includes a main body 2201, a casing 2202, a display portion 2203, a keyboard 2204, an external connection port 2205, a pointing mouse 2206, and the like. The present invention can be applied to the display portion 2203.

FIG. 6D illustrates a mobile computer which includes a main body 2301, a display portion 2302, a switch 2303, an operation key 2304, an infrared port 2305, and the like. The present invention can be applied to the display portion 2302.

Figure 6F:
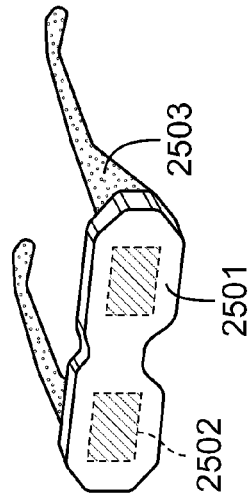
Figure 6H:
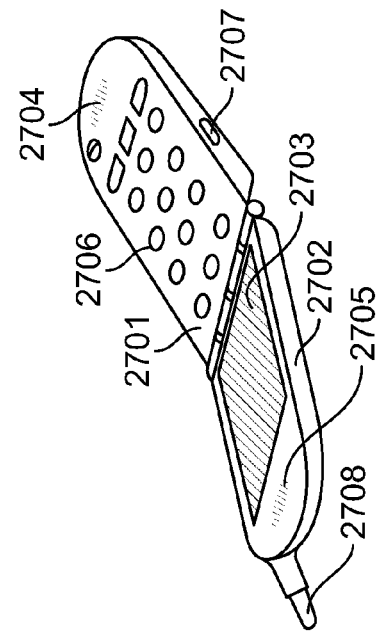
Figure 6E:
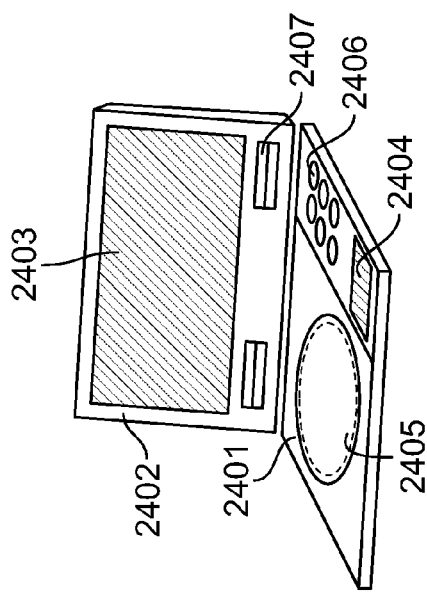

FIG. 6E illustrates a portable image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 and the like. The display portion A 2403 is used mainly for displaying image information, while the display portion B 2404 is used mainly for displaying character information. The present invention can be applied to these display portions A 2403 and B 2404. The image reproduction apparatus including a recording medium further includes a game machine or the like.

FIG. 6F illustrates a goggle type display (head mounted display) which includes a main body 2501, a display portion 2502, arm portion 2503, and the like. The present invention can be applied to the display portion 2502.

Figure 6G:
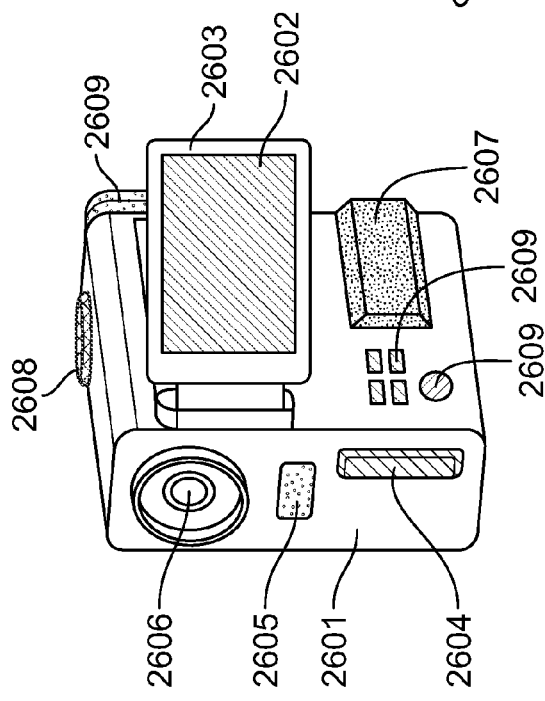

FIG. 6G illustrates a video camera which includes a main body 2601, a display portion 2602, a casing 2603, an external connecting port 2604, a remote control receiving portion 2605, an image receiving portion 2606, a battery 2607, a sound input portion 2608, an operation key 2609, and the like. The present invention can be applied to the display portion 2602.

FIG. 6H illustrates a mobile telephone which includes a main body 2701, a casing 2702, a display portion 2703, a sound input portion 2704, a sound output portion 2705, an operation key 2706, an external connecting port 2707, an antenna 2708, and the like. The present invention can be applied to the display portion 2703. Note that the display portion 2703 can reduce power consumption of the mobile telephone by displaying white-colored characters on a black-colored background.

When the brighter luminance of light emitted from the light emitting material becomes available in the future, the light emitting device of the present invention will be applicable to a front-type or rear-type projector in which a light including output image information is enlarged by means of lenses or the like to be projected.

The aforementioned electronic apparatuses are more likely to be used for display information distributed through a telecommunication path such as Internet, a CATV (cable television system), and in particular likely to display moving picture information. Since the response speed of the light emitting materials is very high, the light emitting device is preferably used for moving picture display.

A portion of the light emitting device that is emitting light consumes power, so it is desirable to display information in such a manner that the light-emitting portion therein becomes as small as possible. Accordingly, when the light emitting device is applied to a display portion which mainly displays character information, e.g., a display portion of a portable information terminal, and more particular, a mobile telephone or a sound reproduction device, it is desirable to drive the light emitting device so that the character information is formed by a light emitting portion while a non-emission portion corresponds to the background.

As set forth above, the present invention can be applied variously to a wide range of electronic apparatuses in all fields. The electronic apparatuses in this embodiment mode can be obtained by utilizing a light emitting device having a configuration in which the structures in Embodiment modes 1 through 6 are freely combined.

The present invention is characterized in that a voltage is applied to a gate electrode of the driving transistor and to a drain electrode or source electrode thereof so that the driving transistor operates with its $|V_{DS}|$ set equal to or larger than 1 V and equal to or smaller than $|V_{GS}-V_{th}|$. In other words, the present invention is characterized in that a voltage is applied to a signal line for inputting a signal to the gate electrode of the driving transistor and is applied to a power supply line connected with the source electrode or drain electrode of the driving transistor to give these lines appropriate electric potentials. Further, by operating a driving transistor at $|V_{DS}|$ in the above range, it becomes possible to use the driving transistor as a resistor. This makes the value of the current flowing between electrodes of a light emitting element inversely related to the sum of resistance of the light emitting element and resistance of the driving transistor. As a result, the reduction with time in current value of the light emitting element can be slowed down. Accordingly, lowering of light emission luminance with time is reduced and the reliability is improved.

The present invention employs a transistor with its L/W set to 10 or larger and therefore is characterized in that $|V_{GS}|$ of the driving transistor is held by a capacitor between the gate electrode and channel formation region of the driving transistor. In other words, a transistor in the present invention can double as a capacitor element and influence of fluctuation in characteristic of the transistor itself is reduced.

The present invention can be carried out by merely designing a driving transistor to have a channel length which is larger than usual and there is no need to add another manufacturing step. Therefore the present invention can slow down the reduction of the current value without lowering the yield in the manufacturing process.

The resistance of the light emitting element is changed not only with time but also by temperature shift because of its nature. To elaborate, the resistance of the light emitting element declines when the temperature becomes higher than the normal temperature, namely room temperature, and rises when the temperature becomes lower than normal. Since a transistor of the present invention having L/W of 10 or more has a gentle inclination of voltage-current characteristic, there is no large difference between $V_{DS}$ and $V_{EL}$, and the current value is gradually increased accompanying a change in $V_{DS}$. In short, a change in resistance due to temperature shift does not cause a light emission surge, thereby preventing degradation of the light emitting element and burn-in of a display pattern.

TABLE 1

|  | long-sized transistor | standard-sized transistor |
|---|---|---|
| L(μm) | 500 | 5 |
| W(μm) | 7 | 7 |
| $|V_{th}|$(V) | 2 | 2 |
| $|V_{GS}|$(V) | 9.7 | 5.1 |
| 101(V) | 10 | 5.1 |
| 102(V) | 0.3 | 0 |
| 103(V) | 5.023 | 5.014 |
| 104(V) | 0 | 0 |
| I(nA) | 500 | 500 |
| R(MΩ) | 10 | 10 |

TABLE 2

|  | long-sized transistor | | | standard-sized transistor | | |
|---|---|---|---|---|---|---|
|  | $|V_{DS}|$(V) | I(nA) | rate of change of current value(%) | $|V_{DS}|$(V) | I(nA) | rate of change of current value(%) |
| 10(MΩ) | 4.997 | 500 |  | 0.086 | 500 |  |
| 12(MΩ) | 4.387 | 467 | 93 | 0.071 | 419 | 84 |
| 15(MΩ) | 3.706 | 419 | 84 | 0.057 | 336 | 67 |

TABLE 3

|  | transistor 307 | transistor 321 | transistor 322 |
|---|---|---|---|
| L(μm) | 500 | 250 | 250 |
| W(μm) | 7 | 7 | 7 |
| $|V_{th}|$(V) | 2 | 2 | 2 |
| $|V_{GS}|$(V) | 9.1 | 7 | 7 |

TABLE 4

|  | transistor 307 | | | transistor 321 | transistor 322 | transistor 321 + transistor 322 | |
|---|---|---|---|---|---|---|---|
|  | $|V_{DS}|$(V) | I(nA) | rate of change of current value(%) | $|V_{DS}|$(V) | $|V_{DS}|$(V) | I(nA) | rate of change of current value(%) |
| 10(MΩ) | 7.1 | 495 |  | 5 | 5 | 503 |  |
| 15(MΩ) | 5.2 | 460 | 92 | 3.1 | 4.5 | 497 | 98 |

What is claimed is:
1. A light-emitting device comprising:
a pixel including a signal line, a scanning line, a light-emitting element, a first transistor, and a second transistor over a substrate,
wherein one of source and drain of the first transistor is electrically connected to the light-emitting element, a gate of the first transistor is electrically connected to one of source and drain of the second transistor, wherein the other of source and drain of the second transistor is electrically connected to the signal line, a gate of the second transistor is electrically connected to the scanning line, wherein a semiconductor including a channel of the first transistor has a region extending in a first direction and a region extending in a second direction under the gate of the first transistor, and wherein the first direction is not parallel to the second direction.

2. The light-emitting device according to claim 1, wherein the semiconductor including the channel of the first transistor has an S-shape.

3. The light-emitting device according to claim 1, wherein a channel length L and a channel width W of the first transistor satisfies L/W≥10.

4. The light-emitting device according to claim 1, wherein the other of source and drain of the first transistor is electrically connected to a power supply line.

5. The light-emitting device according to claim 1, wherein the light-emitting device is incorporated in one selected from the group consisting of a digital still camera, a lap-top computer, a mobile computer, a portable image reproduction apparatus, a goggle type display, a video camera, and a mobile telephone.

6. A light-emitting device comprising:

a pixel including a signal line, a scanning line, a light-emitting element, a first transistor, and a second transistor over a substrate, wherein one of source and drain of the first transistor is electrically connected to the light-emitting element, a gate of the first transistor is electrically connected to one of source and drain of the second transistor, wherein the other of source and drain of the second transistor is electrically connected to the signal line, a gate of the second transistor is electrically connected to the scanning line, wherein a semiconductor including a channel of the first transistor has a region extending in a first direction and a region extending in a second direction under the gate of the first transistor, and wherein the first direction is orthogonal to the second direction.

7. The light-emitting device according to claim 6, wherein the semiconductor including the channel of the first transistor has an S-shape.

8. The light-emitting device according to claim 6, wherein a channel length L and a channel width W of the first transistor satisfies L/W≥10.

9. The light-emitting device according to claim 6, wherein the other of source and drain of the first transistor is electrically connected to a power supply line.

10. The light-emitting device according to claim 6, wherein the light-emitting device is incorporated in one selected from the group consisting of a digital still camera, a lap-top computer, a mobile computer, a portable image reproduction apparatus, a goggle type display, a video camera, and a mobile telephone.

11. A light-emitting device comprising:

a transistor including a gate electrode and a channel in a semiconductor over a substrate, wherein the semiconductor including the channel has a region extending in a first direction and a region extending in a second direction under the gate of the transistor, and wherein the first direction is not parallel to the second direction.

12. The light-emitting device according to claim 11, wherein the semiconductor including the channel of the transistor has an S-shape.

13. The light-emitting device according to claim 11, wherein a channel length L and a channel width W of the first transistor satisfies L/W≥10.

14. The light-emitting device according to claim 11, wherein the light-emitting device is incorporated in one selected from the group consisting of a digital still camera, a lap-top computer, a mobile computer, a portable image reproduction apparatus, a goggle type display, a video camera, and a mobile telephone.

15. A light-emitting device comprising:

a transistor including a gate electrode and a channel in a semiconductor over a substrate, wherein the semiconductor including the channel has a region extending in a first direction and a region extending in a second direction under the gate of the transistor, and wherein the first direction is orthogonal to the second direction.

16. The light-emitting device according to claim 15, wherein the semiconductor including the channel of the transistor has an S-shape.

17. The light-emitting device according to claim 15, wherein a channel length L and a channel width W of the transistor satisfies L/W≥10.

18. The light-emitting device according to claim 15, wherein the light-emitting device is incorporated in one selected from the group consisting of a digital still camera, a lap-top computer, a mobile computer, a portable image reproduction apparatus, a goggle type display, a video camera, and a mobile telephone.

* * * * *